(12) United States Patent
Morikawa

(10) Patent No.: US 6,172,384 B1
(45) Date of Patent: Jan. 9, 2001

(54) FIELD EFFECT TRANSISTOR AND A METHOD FOR MANUFACTURING A SAME

(75) Inventor: Junko Morikawa, Tokyo (JP)

(73) Assignee: NEC Corporation, Tokyo (JP)

( * ) Notice: Under 35 U.S.C. 154(b), the term of this patent shall be extended for 0 days.

(21) Appl. No.: 09/095,710

(22) Filed: Jun. 11, 1998

(30) Foreign Application Priority Data

Jun. 11, 1997 (JP) .................................... 9-153621

(51) Int. Cl.⁷ .......................... H01L 29/80; H01L 31/112
(52) U.S. Cl. ............................................ 257/284; 257/280
(58) Field of Search ..................................... 257/284, 280

(56) References Cited

U.S. PATENT DOCUMENTS 5,504,353 * 4/1996 Kazuhara .

FOREIGN PATENT DOCUMENTS

| 0 533 497 A2 | 3/1993 | (EP) . |
| 0 725 432 A2 | 8/1996 | (EP) . |
| 0 725 432 A3 | 8/1996 | (EP) . |
| 62-202564 | 9/1987 | (JP) . |
| 3-160733 | 7/1991 | (JP) . |
| 8-18047 | 1/1996 | (JP) . |
| 8-46146 | 2/1996 | (JP) . |
| 8-97237 | 4/1996 | (JP) . |
| 9-321063 | 12/1997 | (JP) . |

OTHER PUBLICATIONS

Axel Hülsmann, et al., "Fabrication of High Breakdown Pseudomorphic Modulation Doped Field . . . ," Japenese Journal of Applied Physics, vol. 33, No. 12B, Part 01, pp. 7194–7198, Dec. 1, 1994.

T. Kunii, et al., "A High Power Density and High Efficiency UHF–Band HFET for Low Voltage Operation," IEE MTT–S Int'l Microwave Symposium Digest, vol. 2, pp. 575–578, May 16–20, 1995.

* cited by examiner

Primary Examiner—Stephen D. Meier
(74) Attorney, Agent, or Firm—Foley & Lardner

(57) ABSTRACT

It is an object of the invention to solve a problem that a gate breakdown voltage and RF characteristics of a field effect transistor, which is provided with a double recess composed of a wide recess and a narrow recess, is not satisfactory. This problem results from the fact that a AlGaAs layer is exposed on a surface of the wide recess. The method for fabricating the field effect transistor comprise the steps of successively forming the first active layer, the first stopper layer, the second active layer, the second stopper layer and the third active layer on a substrate, forming a wide recess by etching a predetermined part of the third active layer till the second stopper is exposed, exposing the second active layer by removing the second stopper layer exposed on the bottom surface of the wide recess, and forming a narrow recess, which has a smaller aperture area than that of the wide recess, by etching a predetermined part of the exposed second active layer till the first stopper layer is exposed.

5 Claims, 7 Drawing Sheets

- 7a RESIST
- 6 n-GaAs LAYER
- 5 n-AlGaAs LAYER
- 4 n-GaAs LAYER
- 3 n-AlGaAs LAYER
- 2 n-GaAs LAYER
- 1 GaAs SUBSTRATE

8 WIDE RECESS

FIELD EFFECT TRANSISTOR AND A METHOD FOR MANUFACTURING A SAME

FIELD OF THE INVENTION

The invention relates to a field effect transistor and a method for manufacturing the same, and especially to a GaAs field effect transistor, which generates high output power and is required to be highly reliable, and a method for manufacturing the same.

BACKGROUND OF THE INVENTION

A GaAs field effect transistor provided with a double recess attracts attentions of electronic engineers as a device, which generates a high output power and withstands a high voltage applied thereto. The double recess is composed of a wide recess and a narrow recess, each having a form of a step of stairs, and formed by etching GaAs in most cases. In order to stabilize the characteristics of the GaAs field effect transistor, it is indispensable to form the wide and narrow recesses with high accuracy. In a method for forming a double recess, which is proposed in a recent year, GaAs active layers and thin AlGaAs etching stopper layers are grown alternately and successively on a GaAs substrate, and the double recess is formed by selectively etching the aforementioned multilayered semiconductor. According to this method, the double recess can be exactly formed because of the presence of the etching stopper layers, and a drain current, a threshold voltage and a gate breakdown voltage of the field effect transistor can be stabilized. However, according to the aforementioned method, a AlGaAs etching stopper layer is exposed on the wide recess. The etching stopper layer is easily oxidized, and surface state levels arise therein, which bring about the fluctuations of the characteristics of the field effect transistors. It is extremely desirable to remove the etching stopper exposed on the wide recess.

SUMMARY OF THE INVENTION

Accordingly, it is an object of the invention to provide a field effect transistor with satisfactory DC and RF performances.

It is a further object of the invention to provide a method for fabricating a field effect transistor with satisfactory and RF performances.

According to the first feature of the invention, a field effect transistor comprises:

a first active layer, a first semiconductor layer and a second active layer successively formed on a substrate, a narrow recess starting from a top surface of the second active layer and reaching a top surface of the first semiconductor layer, a second semiconductor layer and a third active layer successively formed on a top surface of the second active layer except a region above the narrow recess, a wide recess starting from a top surface of the third active layer and reaching the top surface of the second active layer and having a larger aperture area than that of the narrow recess, a gate electrode formed on a bottom surface of the narrow recess, and source and drain electrodes respectively formed on the top surface of the third active layer.

According to the second feature of the invention, a method for fabricating a field effect transistor comprises the steps of:

successively growing a first active layer, a first semiconductor layer, a second active layer, a second semiconductor layer and a third active layer on a substrate, forming a first recess by etching a predetermined part of the third active layer till the second semiconductor layer is exposed, exposing the second active layer by removing the second semiconductor layer exposed on a bottom surface of the first recess, and forming a second recess, which has smaller aperture area than that of the first recess, by etching a predetermined part of the second active layer till the first semiconductor layer is exposed.

BRIEF DESCRIPTION OF THE DRAWINGS

The invention will be explained in more detail in conjunction with appended drawings, wherein.

DESCRIPTION OF THE PREFERRED EMBODIMENTS

Before explaining a field effect transistor and a method for fabricating the same in the preferred embodiments according to the invention, the aforementioned conventional field effect transistor and the method for fabricating the same will be explained.

Figure 1:
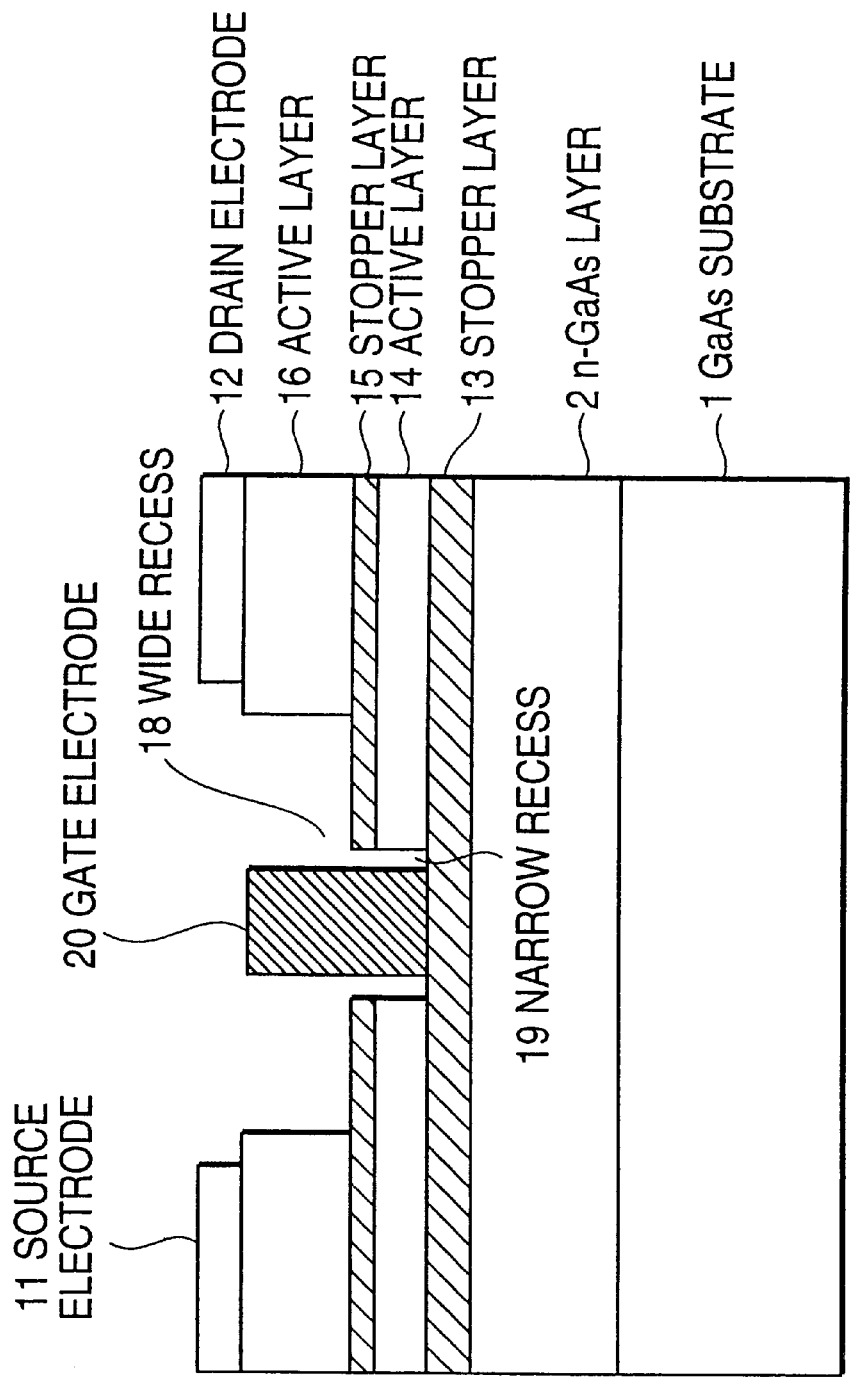
FIG. 1 shows a cross-sectional view of a conventional field effect transistor.

In a recent year, a GaAs field effect transistor for generating high output power was proposed. Especially, in a GaAs field effect transistor disclosed in Japanese Patent Kokai 8-97237, both sides of a recess have forms of two steps of stairs in order to meet the requirement that the GaAs field effect transistor withstands a high voltage applied thereto. FIG. 1 shows a cross-sectional view of the aforementioned example.

As shown in FIG. 1, a 300 to 500 nm thick n-GaAs active layer is grown on a GaAs substrate 1. In the course of epitaxial growth of the active layer, two 5.0 to 20 nm thick AlGaAs layers serving as stopper layers are respectively grown at positions, which are respectively 50 to 150 nm and 100 to 250 nm high above the top surface of the GaAs substrate. Accordingly, the 50 to 150 nm thick active layer 2, the 5.0 to 20 nm thick stopper layer 13, the 45 to 80 nm thick active layer 14, the 5.0 to 20 nm thick stopper layer 15 and the 195 to 230 nm thick active layer 16 are grown epitaxially and successively on the GaAs substrate 1. Next, a source electrode 11 and a drain electrode 12 are formed on the active layer 16 by photolithography and lift-off technique. Next, after forming a resist pattern with predetermined widths of a aperture area, which determines the outer periphery or a wide recess 18, wet etching of the active layer (selective recess etching) is carried out by using the aforementioned resist pattern as a mask. In this step, a part of the active layer is selectively etched using enchant with low solubility on the stopper layer (mixture of citric acid and hydrogen peroxide solution, for example). The wide recess 18 can be formed by this process. Thereafter, the resist pattern is removed, and another resist pattern for forming a narrow recess is formed. Using this resist as a mask, the stopper layer is anisotropically etched and the active layer is exposed. Furthermore, only a part of the active layer is selectively recess etched by using the aforementioned etchant having low solubility on the stopper layer. The recess 19 is formed by this process. Thereafter, using a resist pattern as a mask, a gate electrode is formed by evaporation lift-off technique, and the resist pattern is removed. In this way, the gate electrode 20 is formed on the top surface of the stopper layer 13 in the narrow recess 19. According to the aforementioned fabrication process, the fluctuations of the shapes of the wide and narrow recesses of the field effect transistors can be suppressed, and drain currents, threshold voltages and withstand voltages of the field effect transistors can be stabilized.

According to the conventional method for forming a double recess, the AlGaAs layer, which was used as the etching stopper layer, is exposed to the air after GaAs/AlGaAs selective etching for forming the wide recess. Since the AlGaAs layer is easily oxidized, when the AlGaAs layer makes up the surface of the wide recess, the surface state levels are arisen therein. The surface state levels become the causes of a increased gate leakage current, a decreased gate breakdown voltage, the increased standard deviation of DC characteristics of the field effect transistors fabricated from the same wafer and deterioration of high frequency characteristics.

FIGS. 2A to 5 are cross-sectional views for shown fabrication process of a field effect transistor according to the first preferred embodiment of the invention.

Figure 2A:
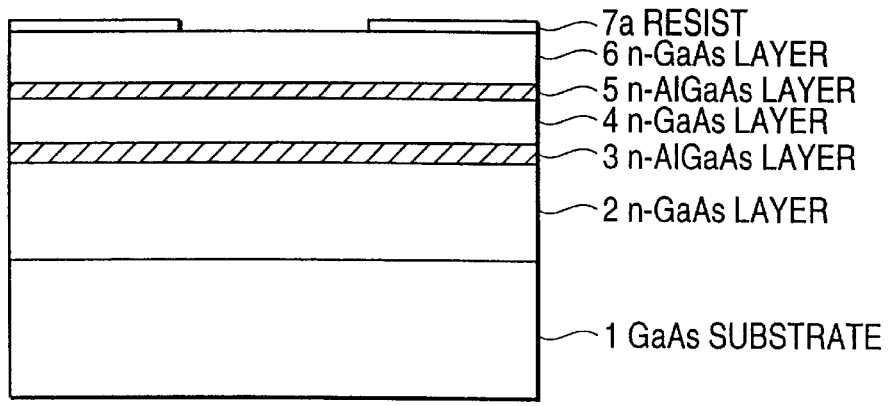
FIGS. 2A to 2C show the first to the third steps of a method for fabricating a field effect transistor.

As shown in FIG. 2A, A n-GaAs active layer 2 is grown on a GaAs substrate 1 as the first active layer, and at a point of time that the n-GaAs active layer 2 becomes 100–250 nm thick, a n-AlGaAs layer 3, which serves as a etching stopper layer in case that a narrow recess is formed, is grown till it becomes 5.0 to 10 nm thick. A 5.0 to 100 nm thick n-GaAs layer 4 is grown as the second active layer on the n-AlGaAs layer 3, on which a n-AlGaAs layer 5 is grown till it becomes about 4.0 to 10 nm (4.0 to 5.0 nm desirably) thick. Furthermore, a n-GaAs layer 6 is epitaxially grown as the third active layer 6 on the n-AlGaAs layer 5. Thereafter, a resist 7a is patterned in a shape of a aperture of a wide recess by photolithography in order to form the wide recess, which corresponds to the first step of the double recess.

Figure 2B:
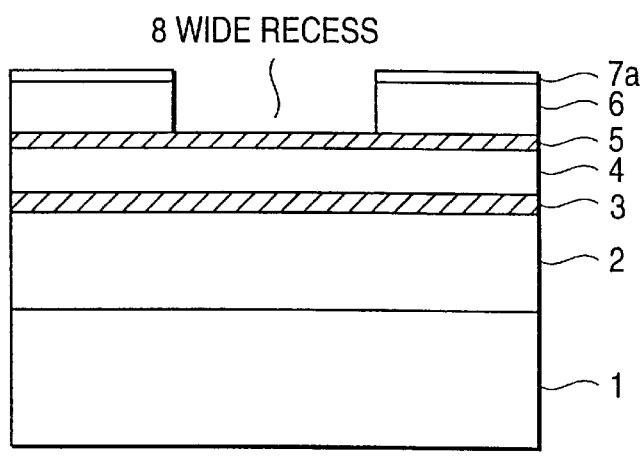

Next, as shown in FIG. 2B, a part of the n-GaAs layer 6, which is not covered with the resist 7a, is selectively dry-etched by $SF_6/BCl_3$ mixture gas. At this time, in order to perfectly remove the n-GaAs layer 6, an AlGaAs layer 5 serving as an etching stopper is over-etched. The etch of the n-GaAs layer 6 and the same of the n-AlGaAs layer 5 are in the ratio 100:1, but the n-AlGaAs layer 5 is etched by 1 to 10 nm because of the aforementioned over etch. Moreover, a part of the n-AlGaAs layer 5, which has not been etched, is damaged in the etching process and becomes a damaged layer. Explaining in more detail, the damaged layer is formed of $AlF_3$. Thereafter, the damaged layer is irradiated by $O_2$ plasma and given water-rinse treatment, or given water-rise treatment without $O_2$ plasma irradiation, as a post pry etch treatment. The aforementioned treatment may be given either before or after the n-AlGaAs layer 5 is exposed to the air.

Figure 2C:
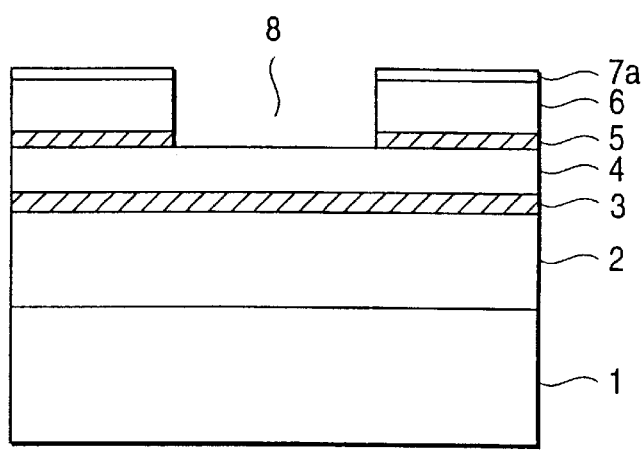
Figure 3A:
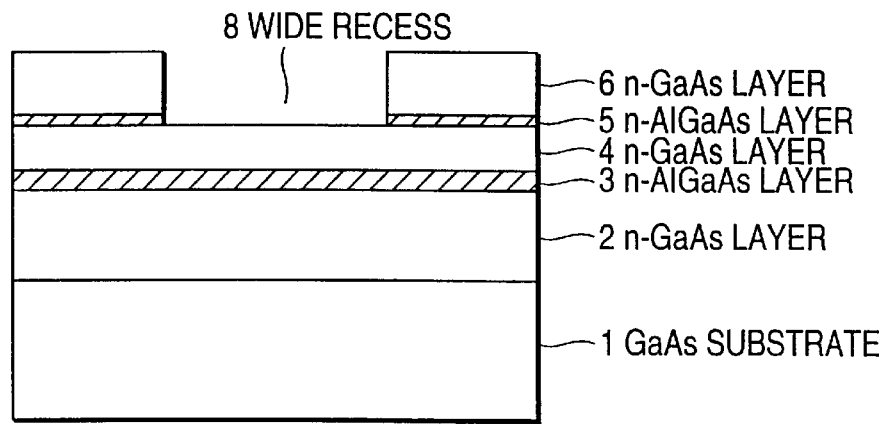
FIGS. 3A to 3C show the fourth to the sixth steps of a method for fabricating a field effect transistor.
Figure 3B:
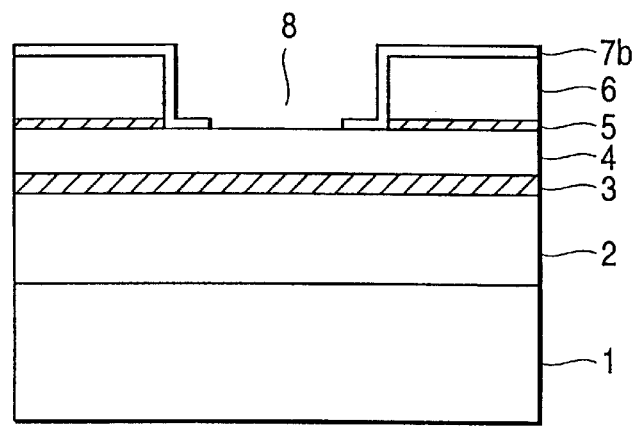
Figure 3C:
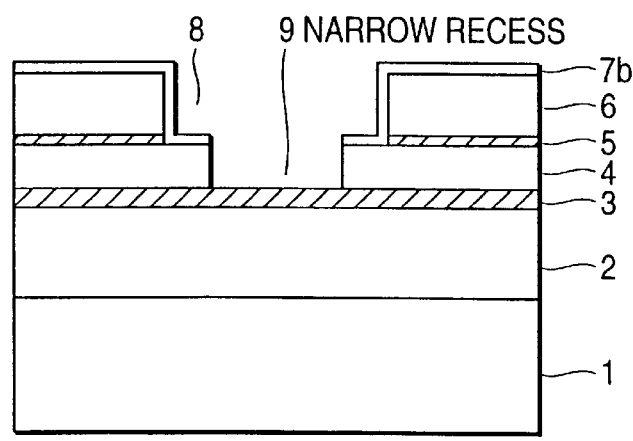

As shown in FIG. 2C, the n-AlGaAs layer 5 remaining on the surface of the wide recess can be removed by the aforementioned procedure. The n-AlGaAs layer 5 can be perfectly removed on condition that it is thinner than 10 nm (5.0 nm desirably) and the aforementioned post dry etch cleaning is carried out. In case that the n-AlGaAs layer 5 is more than 10 nm thick, it is apprehended that an undamaged AlGaAs layer remains under the damaged layer and cannot be removed by post dry etch cleaning.

Figure 4:
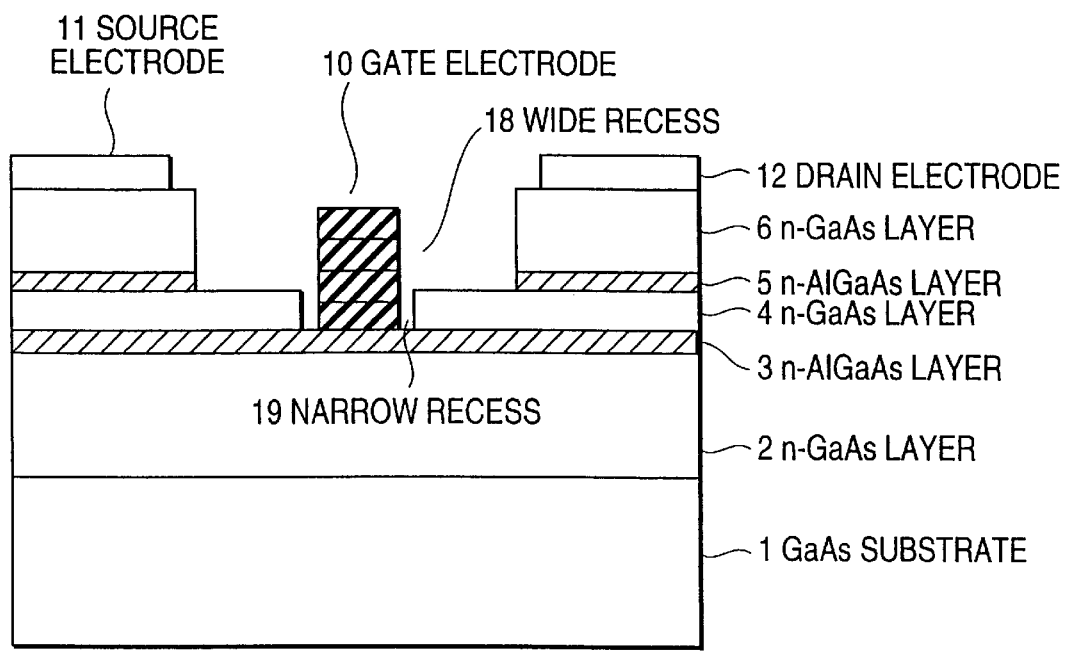
FIG. 4 shows the seventh step of a method for fabricating a field effect transistor.
Figure 5:
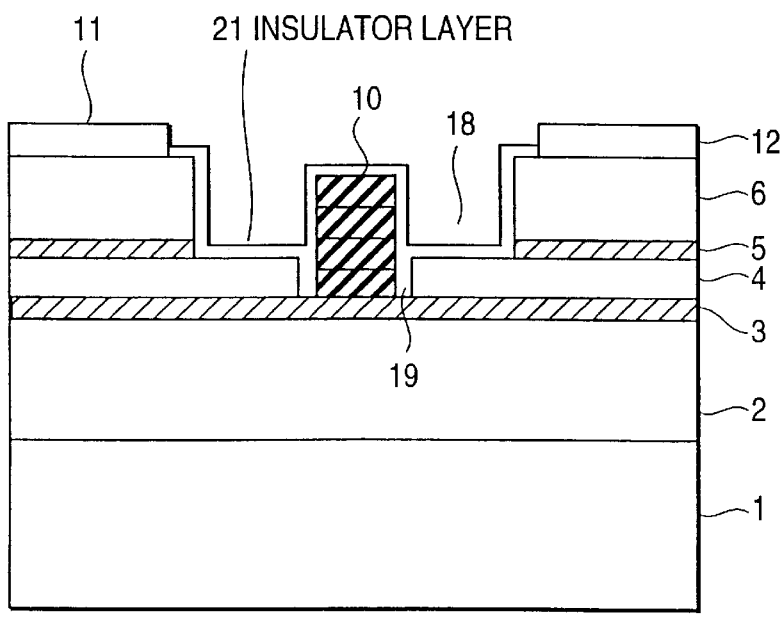
FIG. 5 shows the eighth step of a method for fabricating a field effect transistor.

Thereafter, the resist 7a is removed (FIG. 3A), a resist 7b is further patterned in a shape of an aperture of a narrow recess (FIG. 3B), the n-GaAs layer 4 is removed by selective etching (FIG. 3C), and the narrow recess, corresponding to the second step, is formed. In this case, the n-AlGaAs layer 3 serves as an etching stopper layer. Then, a gate electrode 10 is formed by evaporation lift-off technique on the bottom surface of the narrow recess 19, and a source electrode 11 and a drain electrode 12 are further formed on the third active layer 6 (FIG. 4). Thereafter, as shown in FIG. 5, an insulator layer 21, such as a SiN or $SiO_2$ layer, are grown by chemical vapor deposition (CVD) method so that the insulator layer 21 covers the exposed surfaces of the active layers.

Semiconductor of In series, such as InGaAs, InGap or InP can be used as material of a semiconductor layer.

Fabrication process of a field effect transistor according to the second preferred embodiment are shown in FIGS. 2A to 4 also. An active layer 2, such as a n-GaAs layer, is grown on a GaAs substrate 1, and at a point of time that the active layer 2 becomes 100 to 250 nm thick, an AlGaAs layer 3, which serves as a stopper layer in case that a narrow recess is formed, is grown till it becomes 5.0 to 30 nm thick. A 5.0 to 100 nm thick n-GaAs layer 4 is grown thereon, an about 5.0 to 30 nm thick n-AlGaAs layer 5 is further grown thereon, and moreover a n-GaAs layer 6 in epitaxially grown thereon. Thereafter, in order to form a wide recess, corresponding to the first step, a resist is patterned in a shape of an aperture of a wide recess by photolithography, and a part of the n-GaAs layer 6, which is not masked by the resist, is etched by selective etchant, such as etchant of the citric acid series. Thereafter, the stopper layer, which is exposed on the surface of the wide recess, is removed by non-selective etchant of the phosphoric acid series. According to this method, the n-AlGaAs layer can be removed independently of its thickness. The steps after that of removing the resist are the same as those of the first preferred embodiment.

Figure 6:
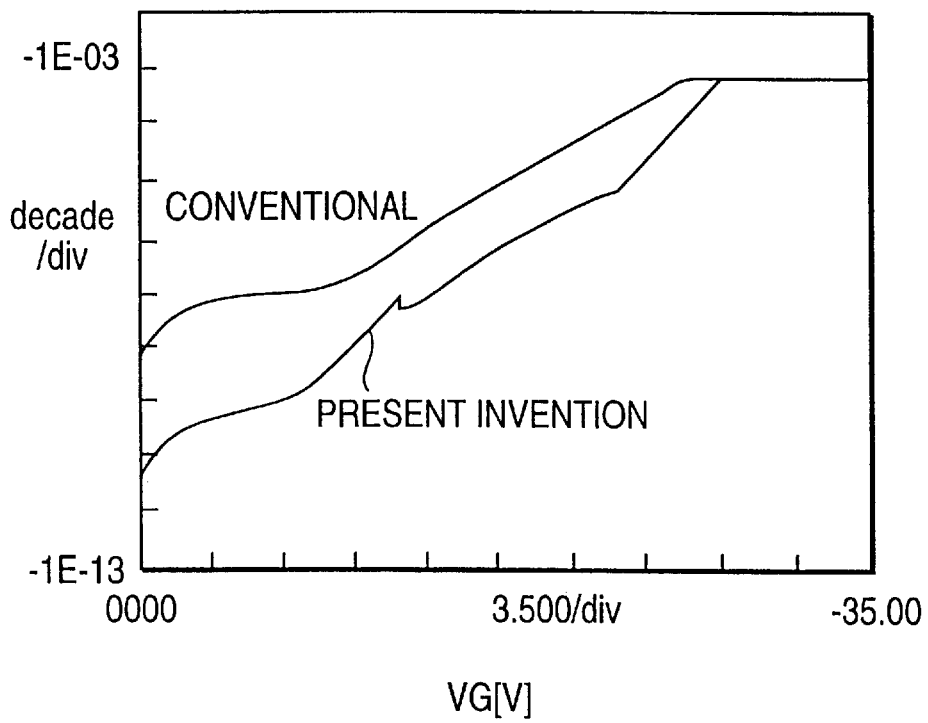
FIG. 6 shows a I-V curve of a field effect transistor according to the invention.
Figure 7:
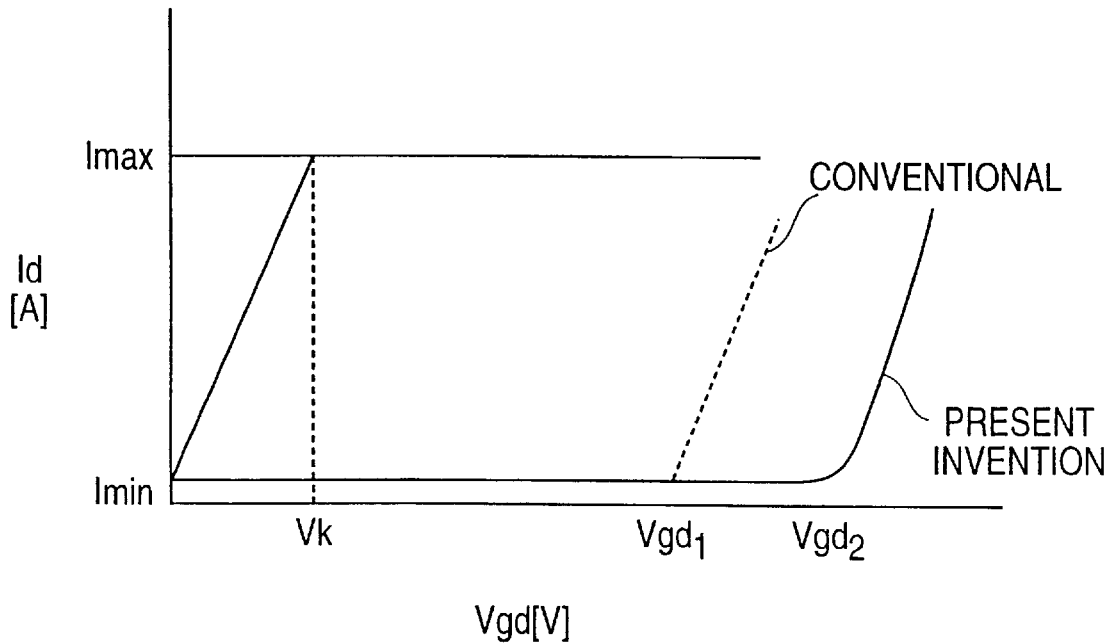
FIG. 7 shows a gate breakdown voltage of a field effect transistor according to the invention.
Figure 8:
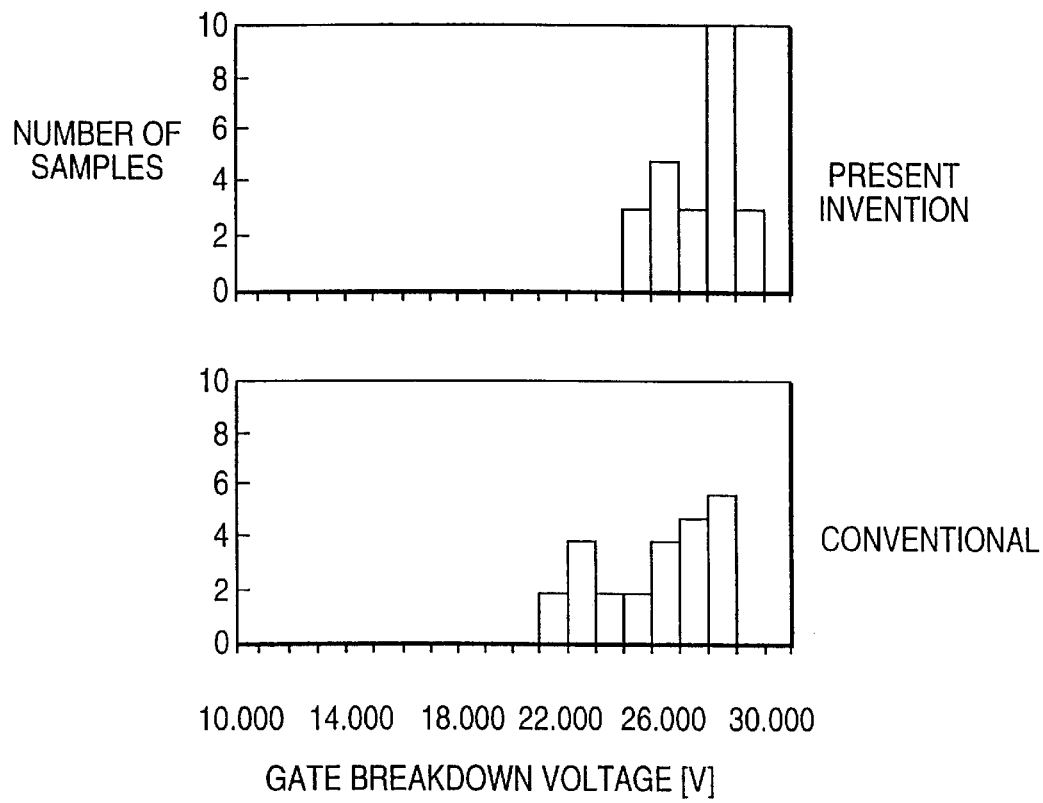
FIG. 8 shows a distribution of gate breakdown voltages of field effect transistors according to the invention fabricated from the same wafer, in comparison with that of conventional field effect transistors.
Figure 9:
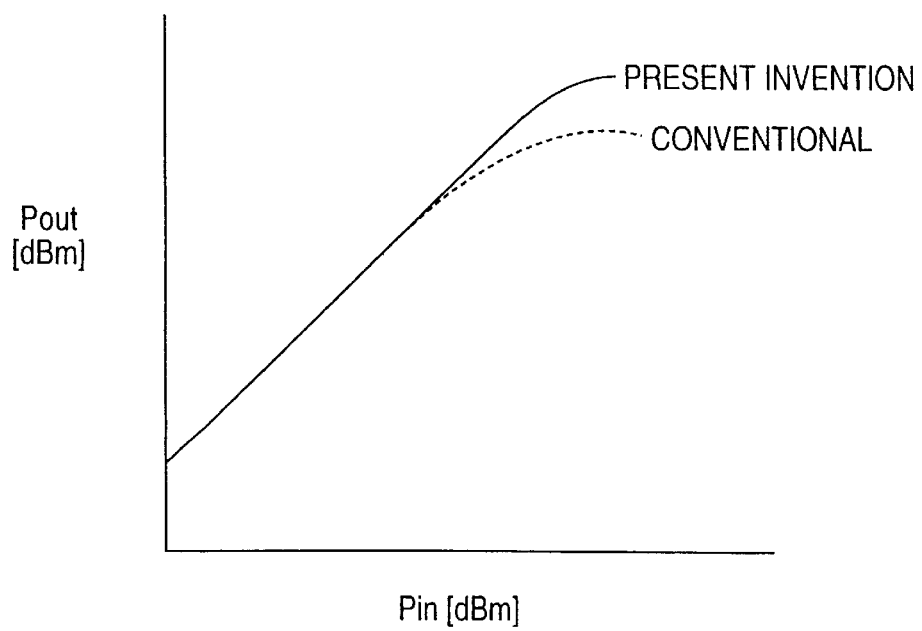
FIG. 9 shows a relation between Pout and Pin of a field effect transistor according to the invention.
Figure 10:
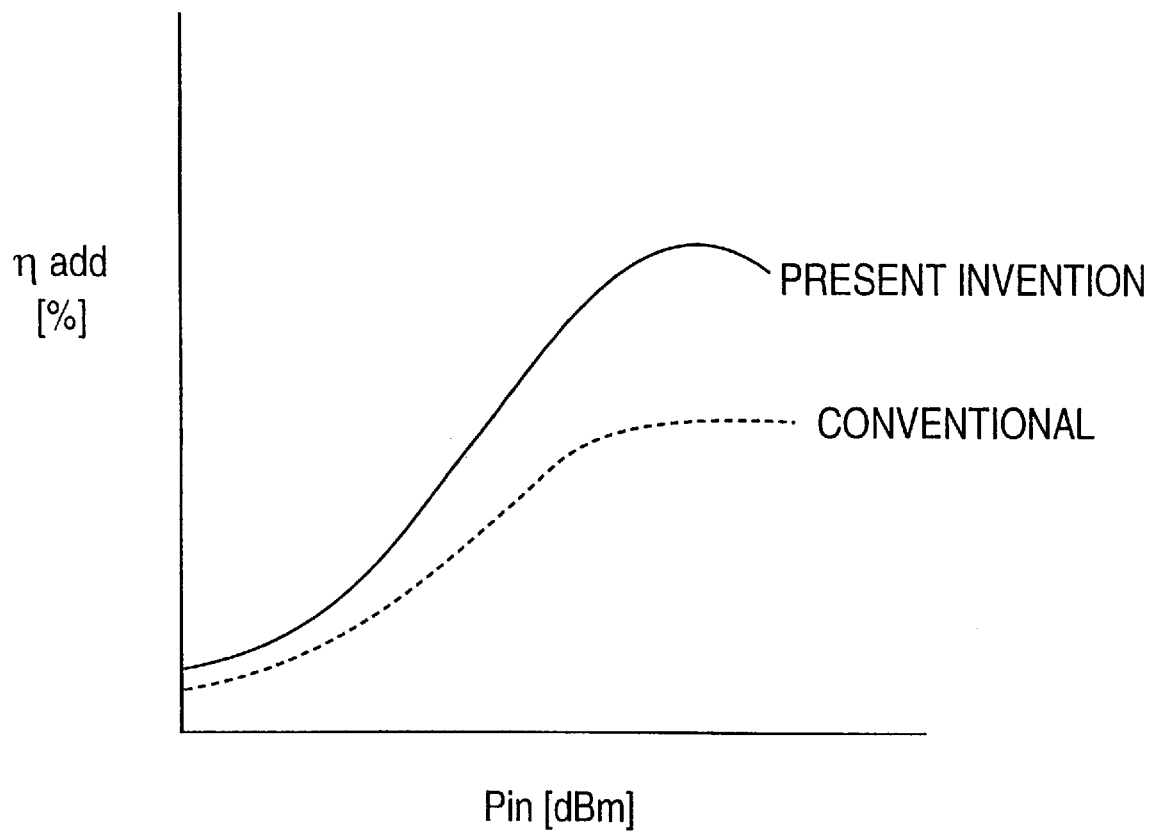
FIG. 10 shows a relation between η add and Pin of a field effect transistor according to the invention.

According to the invention, since the stopper layer on the surface of the wide recess is removed, the surface state levels do not arise, so that the gate leakage current can be reduced as shown in FIG. 6, and the gate breakdown voltage (Vgd) can be increased as shown in FIGS. 7 and 8. Moreover, since the saturation output power Pout and the maximum power-added efficiency η add are respectively given by following equations, the high frequency characteristics (Pout, η add) are improved as shown in FIGS. 9 and 10. Furthermore, since a primary factor of instability caused by oxidization is removed, the standard deviation of DC characteristic of the field effect transistors fabricated from the same wafer can be reduced as shown in FIG. 8, and the fluctuation of high frequency characteristic (RF characteristic) can be suppressed also.

$$Pout = \frac{2}{\pi}(Imax - Imin)(Vgd - Vk)$$

$$\eta add = \frac{(Imax - Imin)(Vgd - Vk)}{2(Imax + Imin)(Vgd + Vk)}$$

According to the fabrication process of the field effect transistor according to the invention, the field effect transistors with excellent and uniform characteristics (a gate breakdown voltage and RF characteristic) can be fabricated with high reproducibility.

Although the invention has been described with respect to specific embodiment for complete and clear disclosure, the appended claims are not to be thus limited but are to be construed as embodying all modification and alternative constructions that may be occurred to one skilled in the art which fairly fall within the basic teaching here is set forth.

What is claimed is that:

1. A field effect transistor comprising:
   a first active layer, a first semiconductor layer and a second active layer successively formed on a substrate,
   a narrow recess starting from a top surface of said second active layer and reaching a top surface of said first semiconductor layer,
   a second semiconductor layer and a third active layer successively formed on a top surface of said second active layer except a region above said narrow recess,
   a wide recess starting from a top surface of said third active layer and reaching said top surface of said second active layer and having a larger aperture area than that of said narrow recess,
   a gate electrode formed on a bottom surface of said narrow recess, and
   source and drain electrodes respectively formed on said top surface of said third active layer.

2. A field effect transistor according to claim 1, wherein:
   material of said first and second semiconductor layers is AlGaAs, InGaAs, InGaP or InP, and that of said first, second and third active layers and said substrate is GaAs.

3. A field effect transistor comprising:
   a first active layer and a first semiconductor layer successively formed on a substrate,
   a second active layer, a second semiconductor layer and a third active layer successively formed on said substrate commonly to provide a recess for exposing said first semiconductor layer, said second semiconductor layer being hidden on top and bottom surfaces by said second and third active layers,
   a gate electrode formed on a part of said first semiconductor layer exposed by said recess, and
   source and drain electrodes formed on said third active layer.

4. A field effect transistor according to claim 3, wherein:
   said recess has a portion defined by said second active layer, and a second portion defined by said second semiconductor layer and said third semiconductor layer, said second portion being wider in area than said first portion, and
   said second semiconductor layer is exposed only at an edge between said second and third active layers.

5. A field effect transistor, according to claim 3, wherein:
   said recess is covered with a protective layer on an inner wall thereof, and said gate electrode is covered with said protective layer on top and side surfaces.

* * * * *